US006950976B1

(12) United States Patent  (10) Patent No.: US 6,950,976 B1
Garrabrant et al.  (45) Date of Patent: Sep. 27, 2005

(54) MAXIMUM LIKELIHOOD DECODING FOR INPUT STREAMS CONTAINING KNOWN DATA

(75) Inventors: Gary Garrabrant, Bellevue, WA (US); Katherine Elliott, Seattle, WA (US)

(73) Assignee: palmOne, Inc., Santa Clara, CA (US)

( * ) Notice: Subject to any disclaimer, the term of this patent is extended or adjusted under 35 U.S.C. 154(b) by 504 days.

(21) Appl. No.: 10/058,168

(22) Filed: Jan. 25, 2002

(51) Int. Cl.$^7$ .............................................. H03M 13/00
(52) U.S. Cl. ...................................................... 714/794
(58) Field of Search ............................... 714/759, 752, 714/746, 794; 375/341

(56) References Cited

U.S. PATENT DOCUMENTS 5,596,589 A * 1/1997 Thomsen et al. ........... 714/759

OTHER PUBLICATIONS

Cho et al., A low power variable decoder for MPEG-2 based on nonuniform fine-grain table partitioning, Jun. 1999, IEEE trans. VLSI sys., vol. 7, No. 2, p. 249-257.*

Wai et al., Improved decoder for transform coding with applications ot the JPEG baseline system,, Feb. 1992, IEEE Trans on Comm., vol. 40. No. 2, p. 251-254.*

* cited by examiner

Primary Examiner—Shelly A Chase
(74) Attorney, Agent, or Firm—Wagner, Murabito & Hao LLP

(57) ABSTRACT

A method is described for decoding a signal in a noise environment using maximum likelihood soft decision decoding for input streams containing known data. ISI problems are ameliorated, and decoding is implemented by palmtop computers and devices of limited computational capability. Decoded signals make use of the (12, 8) Hamming Code for a MOBITEX application. A table with predetermined ISI values is downloaded from a host processor to an on-board DSP at runtime. Known information in the frame header is utilized to help determine unknown data. Decoding proceeds in one embodiment by finding codewords that minimize a sum corresponding to data values extracted from header information. Other tables generated for use contain soft decision information and FEC words. Minimizing data translation by using known data and other embodiments advantageously minimize computational resources required to decode data by maximum likelihood soft decision decoding.

23 Claims, 13 Drawing Sheets

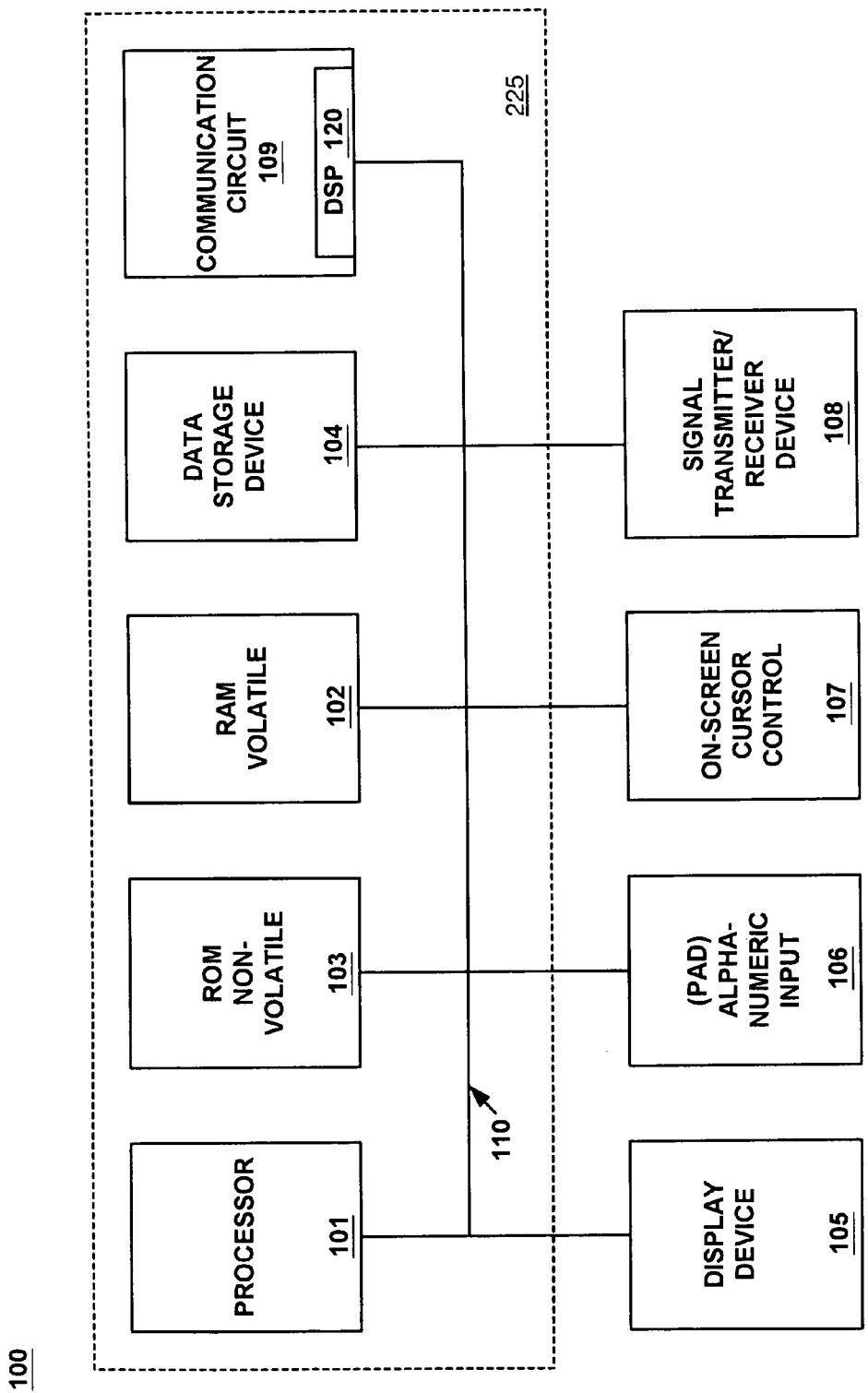

500B

HEADER CONTROL BYTES AND FEC

| | 7 | 6 | 5 | 4 | 3 | 2 | 1 | 0 |
|---|---|---|---|---|---|---|---|---|
| BYTE 4 | \multicolumn{6}{l}{BASE ID 505B1} | \multicolumn{2}{l}{AREA ID.... 505B2} |
| BYTE 5 | \multicolumn{4}{l}{....AREA ID 506B1} | \multicolumn{4}{l}{CONTROL FLAGS 506B2} |
| BYTE 6 | \multicolumn{4}{l}{FEC 1 (P) 507} | \multicolumn{4}{l}{FEC 2 (Q) 508} |

| A5 | C0 | C1 | C2 | C3 | P0 | P3 | Q0 | Q1 | Q2 | Q3 |
|----|----|----|----|----|----|----|----|----|----|----|
| 1  | 0  | 0  | 0  | 0  | 1  | 1  | 1  | 0  | 0  | 1  |

| A5 | C0 | C1 | C2 | C3 | P0 | P3 | Q0 | Q1 | Q2 | Q3 |
|----|----|----|----|----|----|----|----|----|----|----|
| 1  | 0  | 0  | 0  | 0  | 1  | 1  | 1  | 0  | 0  | 1  |

| A5 | C0 | C1 | C2 | C3 | P0 | P3 | Q0 | Q1 | Q2 | Q3 |
|----|----|----|----|----|----|----|----|----|----|----|
| 1  | 0  | 0  | 0  | 0  | 1  | 1  | 1  | 0  | 0  | 1  |

| A5 | C0 | C1 | C2 | C3 | P0 | P3 | Q0 | Q1 | Q2 | Q3 |
|----|----|----|----|----|----|----|----|----|----|----|
| 1  | 0  | 0  | 0  | 0  | 1  | 1  | 1  | 0  | 0  | 1  |

| A5 | C0 | C1 | C2 | C3 | P0 | P3 | Q0 | Q1 | Q2 | Q3 |
|----|----|----|----|----|----|----|----|----|----|----|
| 1  | 0  | 0  | 0  | 0  | 1  | 1  | 1  | 0  | 0  | 1  |

MAXIMUM LIKELIHOOD DECODING FOR INPUT STREAMS CONTAINING KNOWN DATA

BACKGROUND OF THE INVENTION

1. Field of the Invention

The present invention relates to the field of data processing systems. Specifically, the present invention relates to a method and system for decoding of information transmitted to a portable computer system.

2. Related Art

As the components required to build a computer system have reduced in size, new categories of computer systems have emerged. One of the more recent categories of computer systems is the "palmtop" computer system. A palmtop computer system is a computer that is small enough to be held in the hand of a user and is thus "palm-sized."

In addition to using keyboards, virtual keyboards and the digitizer, it has also proven convenient to exchange data between a computer system and a palmtop computer using a communication interface, such as a serial or parallel input port. Many palmtop computers also include an infrared communication port for transmitting data over a wireless link. Other palmtop computers further include a radio receiver/transmitter for receiving/transmitting data over a wireless link.

All communication circuits introduce some noise and interference into a signal, whether the signal is analog or digital. In addition, signals are distorted along their transmission path by noise and interference. The noise and interference add elements (errors) to the signals that need to be considered in order to recover the original signal. Simple hard decision decoding of analog signals generated by bit streams of zeros and ones is especially susceptible to noise in the presence of inter-symbol interference (ISI).

The binary data stream is uniquely converted to an analog signal for transmission. Each binary bit generates a pulse of either positive or negative polarity. The transmitted signal of the binary bit stream is the summation of all the individual pulses. ISI corrupts the analog signal generated by streams of binary-encoded digital data as follows. The amplitude of a pulse at a particular time, T, is affected by adjacent pulses at times T−1 and T+1. The analog signal is optimally sampled at the peaks of the pulses. Hard decision decoding determines whether the sample was generated by a one or a zero bit by whether the sample is positive or negative.

The worst case ISI scenarios are those for signals corresponding to 1-0-1 and 0-1-0 sequences, since the destructive interference effects on the part of the signal corresponding to the central bit is the most severe. ISI is troublesome because such amplitude variations mean that it takes a smaller amount of noise to push the amplitude to such a level that a decoding error occurs.

Maximum likelihood soft decision decoders are known in the art to be the optimal method of decoding a signal in the presence of white Gaussian noise. See Blahut, Richard: Theory and Practice of Error Correcting Codes, which is hereby incorporated herein by reference.

Error correcting codes are known in the art and are used to encode and decode a signal in such a way that noise and interference errors can be detected and corrected. In a forward error correcting code, extra (redundant) bits ("parity bits") are added into a stream of data that is to be transmitted to another device. The parity bits are used by the receiving device to detect and correct errors in the received data.

One approach in the prior art involves the application of sub-optimal algorithms that are less computationally intensive. However, this approach is problematic because these have a decreased performance.

Consumer preferences require that palmtops and other such devices be as small, light, and fast as possible. As such, it is desirable to use the processing resources and available memory space, as well as to perform necessary functions such as decoding, as efficiently as possible.

SUMMARY OF THE INVENTION

Accordingly, what is needed is a system or method for efficiently decoding a data stream in a noisy environment, which does not overburden the computational resources available in palmtop computer systems and other small, low-power devices. In particular, the system or method must not consume an inordinately large amount of the available processing capabilities and memory capacity in such devices. The present invention provides these advantages and others not specifically mentioned above but described in the sections to follow.

A method and system are described for efficiently and accurately decoding a signal in white Gaussian noise. A method and system are also described for decoding a signal in a noisy environment using a maximum likelihood soft decision decoder. Further, a method and system are described for decoding a signal in a noisy environment using a maximum likelihood soft decision decoder, which mitigates the problems of inter-symbol interference (ISI). Further still, a method and system are described for decoding a signal in a noisy environment using a maximum likelihood soft decision decoder that mitigates the problems of ISI, which is implemented upon a platform which may have relatively limited computational capabilities.

In one embodiment, the data bits to be transmitted are encoded using a shortened Hamming Code, such as a (12, 8) Hamming Code. The present embodiment is thus compliant with the MOBITEX specification. The problem of ISI is treated in the present embodiment by sequentially processing adjacent 3-bit successions of data. A table stored on a host processor is downloaded to a digital signal processor (DSP) on-board the decoding platform at runtime. The table contains the 8 possible optimally sampled values of the analog signal derived empirically beforehand (e.g., by experimental observation in a laboratory) corresponding to the values of the pulses generated by all possible 3-bit patterns.

In one embodiment, decoding utilizes known information in the frame header. The present embodiment makes use of the known information to decode the unknown information, advantageously reducing the requisite computational power and time to execute the decoding. The decoding platform in some embodiments may be a palmtop computer. Decoding proceeds in some embodiments via maximum likelihood decoding, wherein codewords are found which minimize a certain sum corresponding to data values extracted from header information.

In one embodiment, several lookup tables are consulted. One such table contains the expected samples which take the effect of ISI into consideration as above. Another table contains binary values of certain forward error control (FEC) words. A further table contains, in one embodiment, a list of FEC soft decision words. In the present embodiment, the soft-decision words correspond to 16-bit quantization of a digitally sampled e.g., by analog/digital (A/D) conversion analog waveform carrying binary information.

Importantly, the tables are relatively small in size; a further benefit of the use of previously known information to decode unknown data. This has the advantage of further minimizing the computational resources needed to execute the decoding, such that, in some embodiments, the decoding platform may also be a palmtop computer.

BRIEF DESCRIPTION OF THE DRAWINGS

FIG. 4 is a diagram of one embodiment of a palmtop computer system in accordance with the present invention.

FIG. 5B is a data structure diagram of frame header control bytes and FEC, in accordance with the present invention.

FIG. 6A is a diagram of FEC words including extract bits for ISI determination and extracted from a lookup table, in accordance with the present invention.

FIG. 6B is a diagram of a sliding window for sequentially examining FEC words with ISI determination extract bits, beginning a first examination, in accordance with the present invention.

FIG. 6C is a diagram of a sliding window for sequentially examining FEC words with ISI determination extract bits, sliding into a second sequential examination, in accordance with the present invention.

FIG. 6D is a diagram of a sliding window for sequentially examining FEC words with ISI determination extract bits, sliding into a third sequential examination, in accordance with the present invention.

FIG. 6E is a diagram of a sliding window for sequentially examining FEC words with ISI determination extract bits, sliding into a final sequential examination, in accordance with the present invention.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

Figure 1:
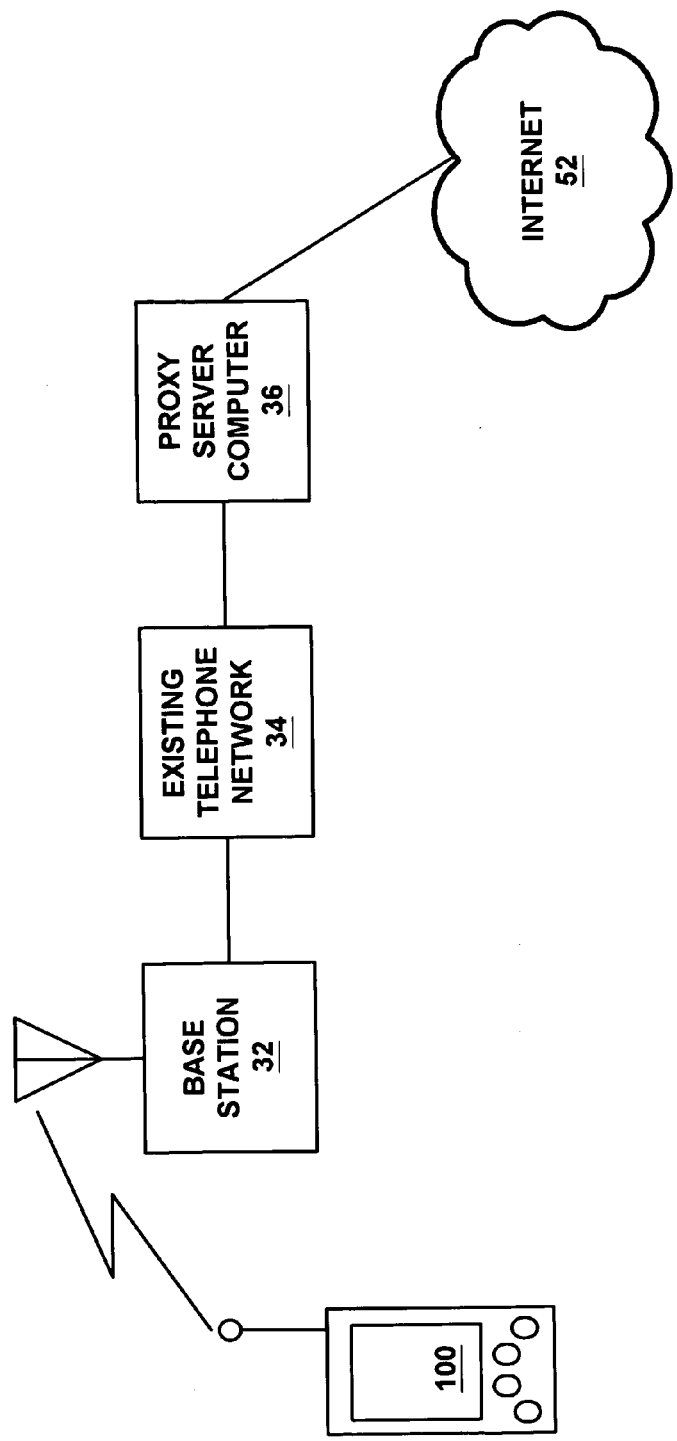
FIG. 1 is a block diagram of an exemplary network environment including a palmtop computer system in accordance with one embodiment of the present invention.
Figure 7:
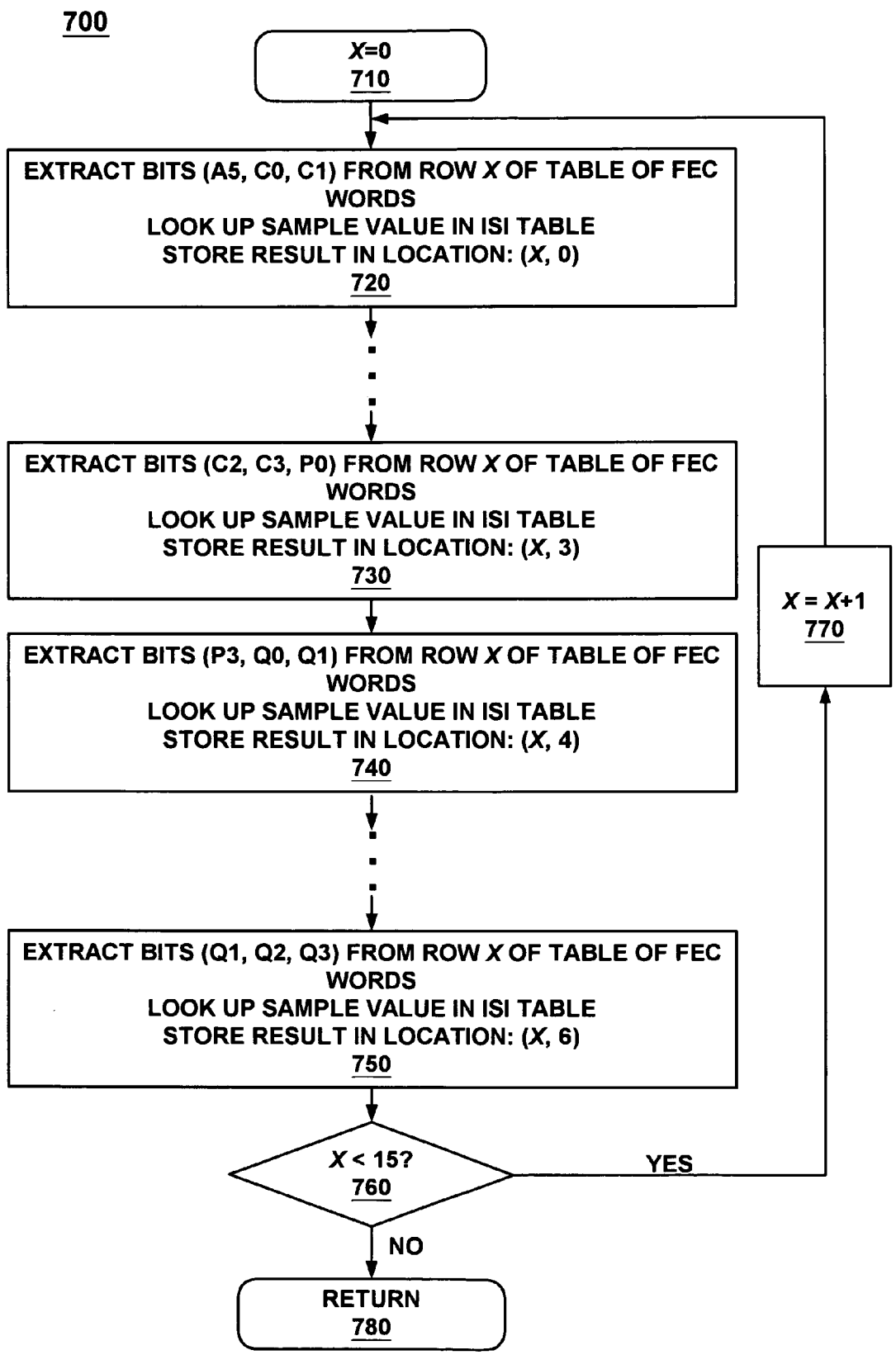
FIG. 7 is a flowchart of the steps in a process for creating a table of FEC soft decision words, in accordance with the present invention.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "extracting" or "looking" or "forming" or "generating" or "storing" or "using" or "combining" or "adding" or "creating" or "choosing" or "selecting" or "minimizing" or "encoding" or "decoding" or "sliding" or "deciding" or "determining" or "tabulating" or "processing" or "remembering" or "subtracting" or "multiplying" or "dividing" or "squaring" or "summing" or "sequencing" or "reading" or "creating" or "generating" or "solving" or the like, refer to the action and processes (e.g., processes 700, 800; FIG. 7, 8 respectively) of a computer system (e.g., computer system 100; FIG. 1, 4) or similar electronic computing device, that manipulates and transforms data represented as physical (electronic) quantities within the computer system's registers and memories into other data similarly represented as physical quantities within the computer system memories or registers or other such information storage, transmission or display devices.

Further, certain aspects of particular embodiments are described herein by reference to tables (e.g., Tables 1–3), such as lookup tables, downloaded from a host processor or promulgated within a receiving entity. It is appreciated that the specific values tabulated below in these tables are exemplary. In actual practice, other values may apply.

Exemplary Palmtop Computer Platform

FIG. 1 is a block diagram of an exemplary network environment 50 including a portable computer system 100 in accordance with one embodiment of the present invention. Portable computer system 100 is also known as a palmtop or palm-sized computer system. Portable computer system 100 has the ability to transmit and receive data and information over a wireless communication interface (e.g., a radio interface).

In the present embodiment, base station 32 is both a transmitter and receiver base station which can be implemented by coupling it into an existing public telephone network 34. Implemented in this manner, base station 32 enables portable computer system 100 to communicate with a proxy server computer system 36, which is coupled by wire to the existing public telephone network 34. Furthermore, proxy server computer system 36 is coupled to the Internet 52, thereby enabling portable computer system 100 to communicate with the Internet 52. It should be appreciated that within the present embodiment, one of the functions of proxy server 36 is to perform operations over the Internet 52 on behalf of portable computer system 100. For example, proxy server 36 has a particular Internet address and acts as a proxy device for portable computer system 100 over the Internet 52. It should be further appreciated that other embodiments of a communications network may be utilized in accordance with the present invention.

The data and information which are communicated between base station 32 and portable computer system 100 are the same type of information and data that can conventionally be transferred and received over a public telephone wire network system. However, a wireless communication interface is utilized to communicate data and information between portable computer system 100 and base station 32. It should be appreciated that one embodiment of a wireless communication system in accordance with the present invention is the MOBITEX wireless communication system.

Figure 2:
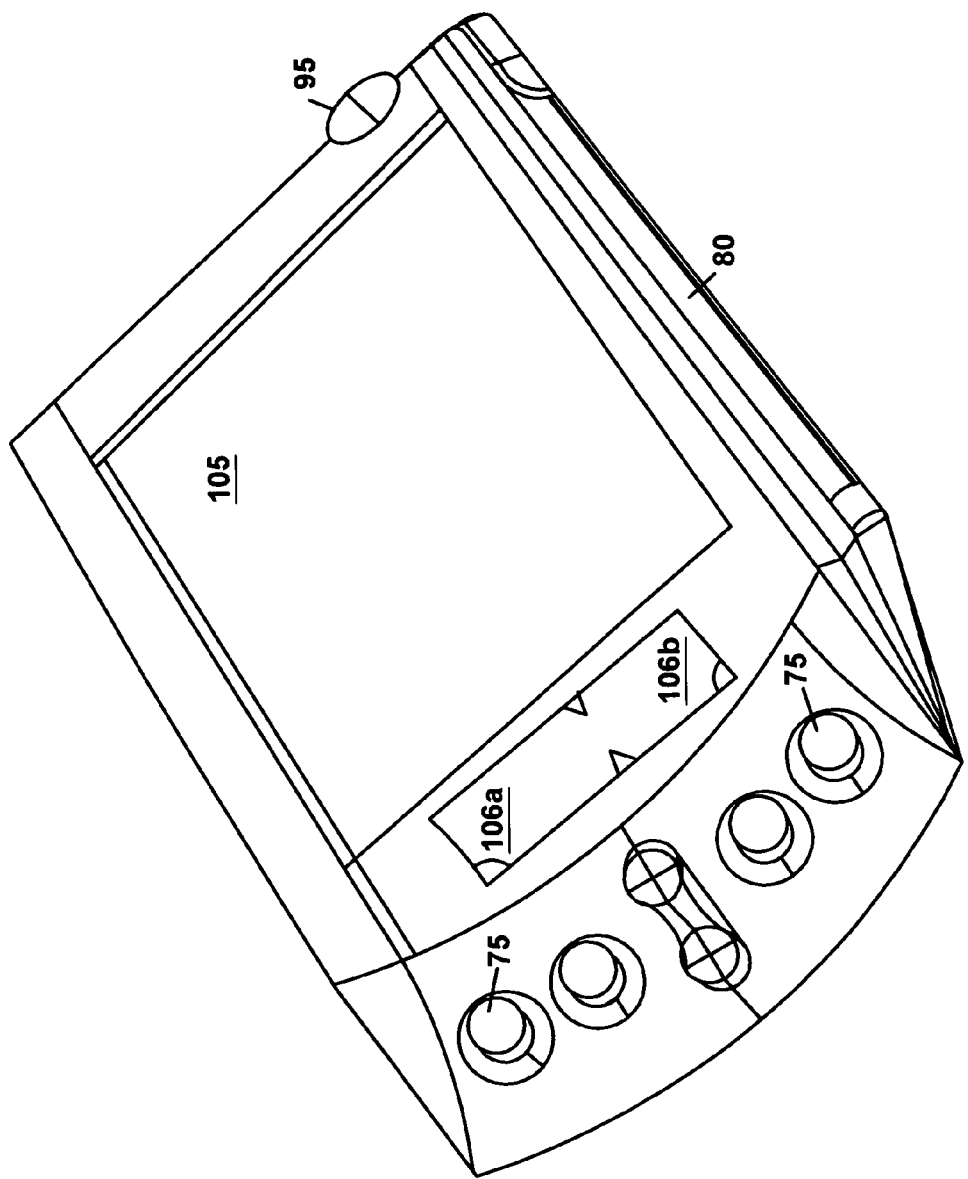
FIG. 2 is a top side perspective view of a palmtop computer system in accordance with one embodiment of the present invention.

FIG. 2 is a perspective illustration of the top face 100a of one embodiment of the palmtop computer system 100 of the present invention. The top face 100a contains a display screen 105 surrounded by a bezel or cover. A removable stylus 80 is also shown. The display screen 105 is a touch screen able to register contact between the screen and the tip of the stylus 80. The stylus 80 can be of any material to make contact with the screen 105. The top face 100a also contains one or more dedicated and/or programmable buttons 75 for selecting information and causing the computer system to implement functions. The on/off button 95 is also shown.

FIG. 2 also illustrates a handwriting recognition pad or "digitizer" containing two regions 106a and 106b. Region 106a is for the drawing of alphabetic characters therein (and not for numeric characters) for automatic recognition, and region 106b is for the drawing of numeric characters therein (and not for alphabetic characters) for automatic recognition. The stylus 80 is used for stroking a character within one of the regions 106a and 106b. The stroke information is then fed to an internal processor for automatic character recognition. Once characters are recognized, they are typically displayed on the screen 105 for verification and/or modification.

Figure 3:
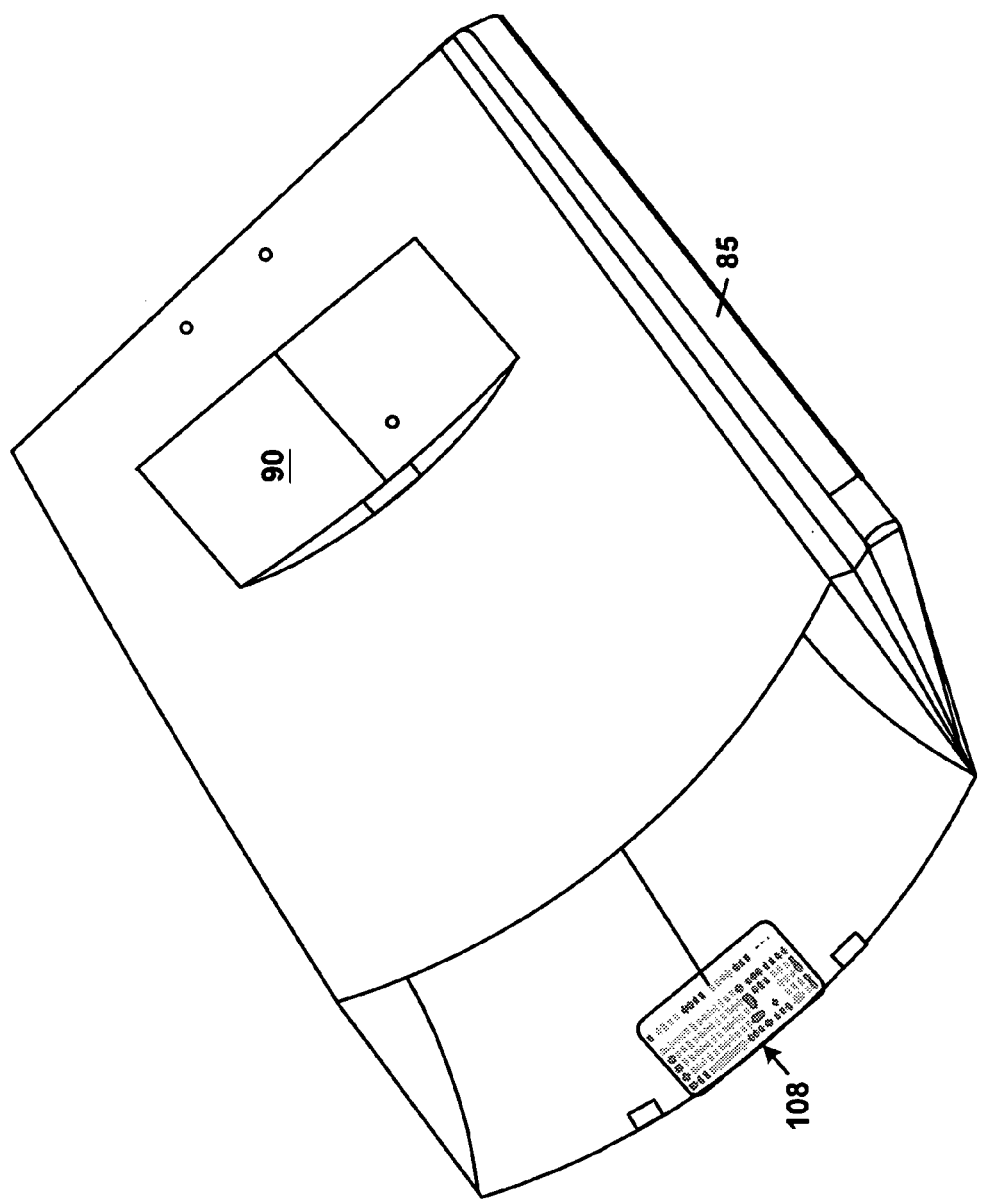
FIG. 3 is a bottom side perspective view of the palmtop computer system of FIG. 2.

FIG. 3 illustrates the bottom side 100b of one embodiment of the palmtop computer system that can be used in accordance with various embodiments of the present invention. An extendible antenna 85 is shown, and also a battery storage compartment door 90 is shown. A communication interface 180 is also shown. In one embodiment of the present invention, the communication interface 180 is a serial communication port, but could also alternatively be of any of a number of well-known communication standards and protocols, e.g., parallel, SCSI (small computer system interface), Firewire (IEEE 1394), Ethernet, etc.

FIG. 4 illustrates circuitry of computer system 100, some of which can be implemented on PC board 225 (FIG. 4). Computer system 100 includes an address/data bus 110 for communicating information, a central processor 101 coupled with the bus for processing information and instructions, a volatile memory 102 (e.g., random access memory, RAM) coupled with the bus 110 for storing information and instructions for the central processor 101 and a non-volatile memory 103 (e.g., read only memory, ROM) coupled with the bus 110 for storing static information and instructions for the processor 101. Computer system 100 also includes an optional data storage device 104 (e.g., memory stick) coupled with the bus 110 for storing information and instructions. Device 104 can be removable. As described above, computer system 100 also contains a display device 105 coupled to the bus 110 for displaying information to the computer user. PC board 225 can contain the processor 101, the bus 110, the ROM 103 and the RAM 102.

With reference still to FIG. 4, computer system 100 also includes a signal transmitter/receiver device 108 which is coupled to bus 110 for providing a physical communication link between computer system 100 and a network environment (e.g., network environment 50 of FIG. 1). As such, signal transmitter/receiver device 108 enables central processor unit 101 to communicate wirelessly with other electronic systems coupled to the network. It should be appreciated that within the present embodiment, signal transmitter/receiver device 108 is coupled to antenna 85 (FIG. 4) and provides the functionality to transmit and receive information over a wireless communication interface. It should be further appreciated that the present embodiment of signal transmitter/receiver device 108 is well-suited to be implemented in a wide variety of ways. For example, signal transmitter/receiver device 108 could be implemented as a modem.

In one embodiment, computer system 100 includes a communication circuit 109 coupled to bus 110. Communication circuit 109 includes a digital signal processor (DSP) 120 for processing data to be transmitted or data that are received via signal transmitter/receiver device 108. In some embodiments, DSP 120 may be optional; the functions of same assumed by communication circuit 109, processor 101, transceiver 108, and/or other components to various degrees and in various combinations. Additional information regarding the functions of communication circuit 109 are provided in conjunction with FIGS. 6A and 6B. Alternatively, some or all of the functions performed by DSP 120 can be performed by processor 101.

Also included in computer system 100 of FIG. 4 is an optional alphanumeric input device 106 which in one implementation is a handwriting recognition pad ("digitizer") having regions 106a and 106b (FIG. 2), for instance. Alphanumeric input device 106 can communicate information and command selections to processor 101. Computer system 100 also includes an optional cursor control or directing device (on-screen cursor control 107) coupled to bus 110 for communicating user input information and command selections to processor 101. In one implementation, on-screen cursor control device 107 is a touch screen device incorporated with display device 105. On-screen cursor control device 107 is capable of registering a position on display device 105 where the stylus makes contact. The display device 105 utilized with computer system 100 may be a liquid crystal display device, a cathode ray tube (CRT), a field emission display device (also called a flat panel CRT) or other display device suitable for creating graphic images and alphanumeric characters recognizable to the user. In the preferred embodiment, display device 105 is a flat panel display.

Maximum Likelihood Decoding for Input Streams Containing Known Data

Exemplary Data Structures

Figure 5A:
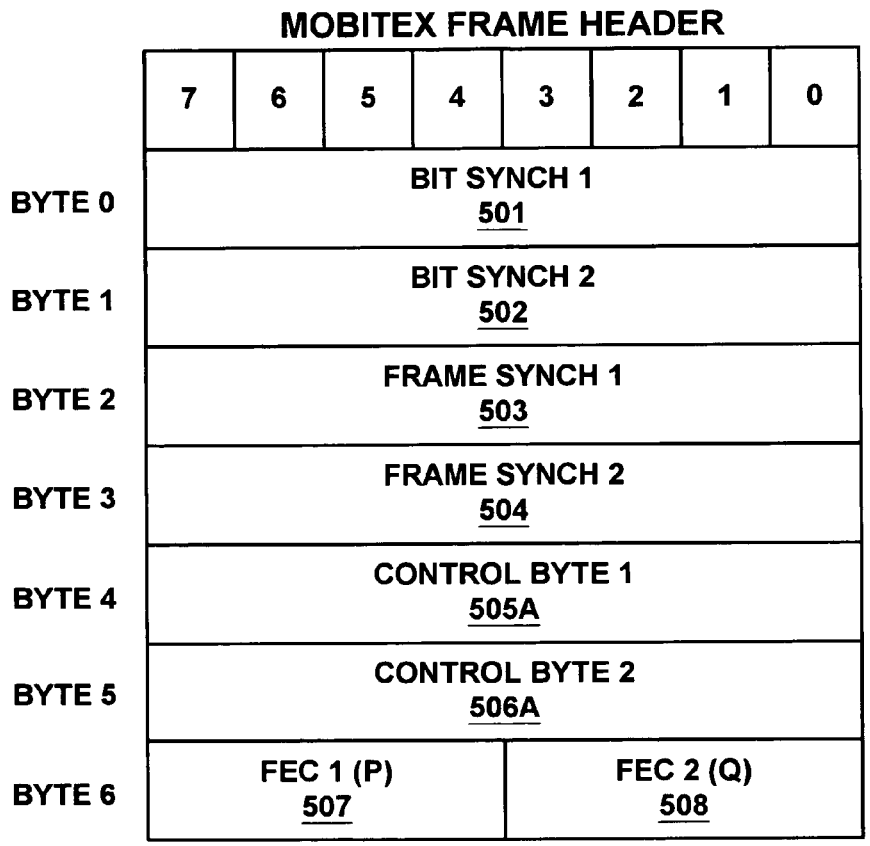
FIG. 5A is a data structure diagram of a frame header compliant with the MOBITEX Standard, in accordance with the present invention.

On the MOBITEX network, data packets include frame headers. Referring now to FIG. 5A, an exemplary frame header 500A typifies a structure characteristic of MOBITEX compliant frame headers. Frame header 500A has seven bytes 0 through 6, each byte eight bits 0 through 7 in size.

Bytes 0 and 1 function as bit synchronization bytes 501 and 502, respectively. Bytes 2 and 3 function as frame synchronization bytes 503 and 504, respectively.

Bytes 4 and 5 function as control bytes 505A and 506A, respectively. Control bytes 505A and 506A have parity. Parity is a redundancy, which helps to effectuate forward error correction (FEC) by application in receptive devices for the detection and corresponding correction of the most likely errors in the received data.

The parity bits for the Control Byte 1 are located in Byte 6, (e.g. 507). The are denoted as FEC 1 (P) in FIG. 5A. Parity for the second control byte (Byte 5) is FEC 2 (Q), in FIG. 5A.

The data constituting frame header 500A is encoded in the present embodiment using a (12, 8) Hamming Code. It is appreciated that, in the present embodiment, there is neither CRC information nor interleaving in MOBITEX frame headers, as there are in certain other data packets. If the data contained within frame header 500A is not decoded correctly, the information contained in the corresponding data block following frame header 500A could be lost as well. Thus, while the data contained within frame header 500A is especially susceptible to errors, it is also extremely important data.

Further on the MOBITEX network, frame headers contain certain information about the base station transmitting the data packets. This information may be constituted by base identification information, as well as information about the location of the base station. The base station identity is known as the base identification, and the base station location is known as the area identification. Tables 2 and 3 below utilize an example frame header having a base identifier of 12 and an area identifier of 25.

FIG. 5B shows a portion of a MOBITEX compliant frame header 500B, which is simply more detail of the frame header 500A (FIG. 5A). Byte 4 is constituted by two sets of bits. The first set of bits, e.g., bits 2 through 7 constitute the six-bit base identifier 505B1. The second set of Byte 4 bits, e.g., bits 0 and 1, are the first two of six area identification bits 505B2.

Byte 4 is encoded using a (12, 8) Hamming Code, and generates four parity bits. In certain modes of operation on the MOBITEX network, the base and area identification bits are known to the receiver. Thus, Byte 4 and its parity bits are known data. The 4 parity bits of Byte 4 are stored in Byte 6, or 507, and referred to as FEC 1 (P).

In the second control byte, e.g., Byte 5, the remaining four area identifier bits 506B1 are also known. These constitute bits 4 through 7 of Byte 5, in the present embodiment. However, the control flags 506B2 are not known. Therefore, the second set of parity bits 508, e.g., FEC 2 (Q) are unknown also because they are generated by Byte 5 which contains unknown data.

ISI-Mitigating Exemplary Data Structure Examination Model

One embodiment of the present invention mitigates the problem with ISI, which encumbers conventional soft decision decoding of MOBITEX compliant data transmissions. In Maximum likelihood decoding, received samples are compared to the expected or 'ideal' values of the samples. An important aspect of this method is determining the expected value of the data stream. In the present embodiment, on the MOBITEX network, the data is severely affected by ISI. The following section describes a method for determining the expected data.

In one embodiment of the present invention, sample values at time T are determined by optimally sampling the signal generated by adding the three pulses corresponding to the bits at T−1, T, and T+1. Thus, in the present embodiment, only 3-bit sequences are considered in any single observation. Sample values are predetermined for all 8 possible 3-bit combinations.

The expected sample values for each of the 8 possible 3-bit combinations are derived empirically, e.g., they can be predetermined in a laboratory by observing the value of samples for known bit patterns under a no noise condition. The resultant 8-word table is stored on a host processor. In one embodiment, the table is downloaded to the DSP (e.g., DSP 120; FIG. 4 or substitute components, as discussed above) at runtime. Table 1, below, exemplifies a table of sample values for the eight 3-bit combinations. It thus functions effectively an ISI table. It is appreciated that the specific values tabulated below in Table 1, as well as values tabulated in other tables herein (e.g., Tables 2, 3) are exemplary. In practice, other values may apply.

TABLE 1

ISI Download Table

| Bit Pattern | Sample Value |
| --- | --- |
| 000 | −3800 |
| 001 | −1978 |
| 010 | 1058 |
| 011 | 2958 |
| 100 | −2954 |
| 101 | −816 |
| 110 | 2008 |
| 111 | 3800 |

In an example of the workings of the present embodiment, a sequence of bits corresponding to a MOBITEX compliant frame header (e.g., frame header 500B; FIG. 5B) is received by an exemplary platform (e.g., system 100; FIG. 1, 4). Referring to FIG. 6A, the present exemplary sequence includes the bits corresponding to constituents of the model frame header of FIG. 5B. These bits include those identified in List 1, below.

List 1

A5: Byte 5/bit 4: area identifier 506B1
C0–C3: Byte 5/bits 3-0: control flags 506B2
P0, P3: Byte 6/bits 7 and 4: FEC 1 (P) 507 parity bits 1 and 3, respectively
Q0–Q3: Byte 6/bits 3–0: FEC 2 (Q) 508

The resultant series 600 is thus:

A5, C0, C1, C2, C3, P0, P3, Q0, Q1, Q2, Q3.  Sequence 1

With reference again to FIG. 5B, a bit stream containing the control bytes of frame header 500B corresponds to the following sequence.

B0, B1, B2, B3, B4, B5, B6, B7, A0, A2, A3, A4, A5, A6, A7, C0, C1, C2, C3, P0, P1, P2, P3, Q0, Q1, Q2, Q3.  Sequence 2

In Sequence 2, B identifies the bits of the base identifier 505B1; A identifies the bits of the area identifier 505B2 and 506B1; C identifies the control flags 506B2; P identifies FEC 1 (P) 507, e.g., the parity bits corresponding to Byte 4 bits; Q identifies FEC 2 (Q) 508, e.g., the parity bits corresponding to Byte 5 bits.

Within the DSP or equivalent functionality (e.g., DSP 120 or substitutes, as discussed above; FIG. 4) of the receiving device (e.g., system 100; FIG. 1, 4) a second table is calculated, effectively functioning as a table of 16 FEC words, Words 0 through 15. This calculation is performed when the host processor transmits to it the base and area identifiers (e.g., base ID 505B1, area ID 505B2 and 506B1; FIG. 5B), which in the present example hold the values 12 and 25, respectively. Table 2, below, exemplifies this table.

TABLE 2

16 FEC Words, Including Extract Bits for ISI Determination

| | A5 | C0 | C1 | C2 | C3 | P0 | P1 | Q0 | Q1 | Q2 | Q3* |
|---|---|---|---|---|---|---|---|---|---|---|---|
| Word 0  | 1 | 0 | 0 | 0 | 0 | 1 | 1 | 1 | 0 | 0 | 1 |
| Word 1  | 1 | 0 | 0 | 0 | 1 | 1 | 1 | 1 | 1 | 0 | 0 |
| Word 2  | 1 | 0 | 0 | 1 | 0 | 1 | 1 | 1 | 1 | 1 | 1 |
| Word 3  | 1 | 0 | 0 | 1 | 1 | 1 | 1 | 1 | 0 | 1 | 0 |
| Word 4  | 1 | 0 | 1 | 0 | 0 | 1 | 1 | 0 | 0 | 0 | 0 |
| Word 5  | 1 | 0 | 1 | 0 | 1 | 1 | 1 | 0 | 1 | 0 | 1 |
| Word 6  | 1 | 0 | 1 | 1 | 0 | 1 | 1 | 0 | 1 | 1 | 0 |
| Word 7  | 1 | 0 | 1 | 1 | 1 | 1 | 1 | 0 | 0 | 1 | 1 |
| Word 8  | 1 | 1 | 0 | 0 | 0 | 1 | 1 | 0 | 0 | 1 | 1 |
| Word 9  | 1 | 1 | 0 | 0 | 1 | 1 | 1 | 0 | 1 | 1 | 0 |
| Word 10 | 1 | 1 | 0 | 1 | 0 | 1 | 1 | 0 | 1 | 0 | 1 |
| Word 11 | 1 | 1 | 0 | 1 | 1 | 1 | 1 | 0 | 0 | 0 | 0 |
| Word 12 | 1 | 1 | 1 | 0 | 0 | 1 | 1 | 1 | 0 | 1 | 0 |
| Word 13 | 1 | 1 | 1 | 0 | 1 | 1 | 1 | 1 | 1 | 1 | 1 |
| Word 14 | 1 | 1 | 1 | 1 | 0 | 1 | 1 | 1 | 1 | 0 | 0 |
| Word 15 | 1 | 1 | 1 | 1 | 1 | 1 | 1 | 0 | 0 | 0 | 1 |

In the present example, with reference to FIG. 5A, Byte 5 (e.g., area ID 506B1 and control flags 506B2; FIG. 5B) is based on the last four area identifier bits (e.g., area ID 506B1: Byte 5/bits 7–4; FIG. 5B) and the four control flag bits (e.g., 506B2; FIG. 5B).

In the present embodiment, the four control bits and the corresponding parity bits are not known. Given the area identifier and the 16 possible combinations of the unknown control flag bits, the corresponding parity bits FEC 2(Q) 508 are calculated.

Table 2 above has a first column displaying the last area identifier bit A5. The next 4 columns of Table 2 above display all of the possible combinations of the control bits C0, C1, C2, and C3, which in the present example are sequentially each of the 24 binary numbers between 0000 and 1111.

Additionally, the table contains parity bits P0 and P3, solely because they affect the ISI of the unknown bits, C3 and Q0. Finally, the last 4 columns of Table 2 display the values of the four parity bits Q0, Q1, Q2, and Q3, corresponding to the parity of the known area bits and each of the 16 possible control flag combinations.

The final table, Table 3, is used to calculate the maximum likelihood estimates. Table 3 is generated by moving a hypothetical sliding observation window across a string of bits to be read. The sliding window is three bits wide, e.g., has an observational capacity of three and only three bits at any particular point in time, such that the string of bits to be read is read sequentially in 3-bit chunks. The lookup table, e.g., Table 1, is consulted to determine the sample value that corresponds to each 3-bit binary chunk. Accordingly, the present embodiment maps, e.g., transcribes a string of binary bits, sequentially three bits at a time, into a corresponding sequence of 7 sample values as determined by Table 1.

In the present example, the first sequence of binary values from Table 2 reads: 1, 0, 0, 0, 0, 1, 1, 1, 0, 0, 1. An arbitrary origin is thus observed in FIG. 10A, prior to any decoding action commencing.

Referring now to FIG. 6B, a hypothetical reading window function 699.p1 with a 3-bit capacity, e.g., spanning three bits, is placed starting at bit A5, as in FIG. 6B. In other words, the window function is in a first position. The first sub-sequence of three bits, corresponding to A5, C0, and C1 is thus read to be: 1 0 0.

The decoder consults Table 1 to find a corresponding sample value for the first bit pattern 100. The sample value corresponding to the binary bit pattern 100 being −2954, the decoder translates the bit pattern read, e.g., 100, to the 16-bit sample value −2954. This translated sample value is stored mnemonically, in one embodiment, in the first row and first column of a third table (e.g., Table 3 below).

TABLE 3

FEC Soft Decision Words

| i = | 0 | 1 | 2 | 3 | 4 | 5 | 6 |
|---|---|---|---|---|---|---|---|
| Word 0  | −2954 | −3800 | −3800 | −1978 | 2008  | −2954 | −1978 |
| Word 1  | −2954 | −3800 | −1978 | 2958  | 3800  | 2008  | −2954 |
| Word 2  | −2954 | −1978 | 1058  | −816  | 3800  | 3800  | 3800  |
| Word 3  | −2954 | −1978 | 2958  | 3800  | 2008  | −816  | 1058  |
| Word 4  | −816  | 1058  | −2954 | −1978 | −2954 | −3800 | −3800 |
| Word 5  | −816  | 1058  | −816  | 2958  | −816  | 1058  | −816  |
| Word 6  | −816  | 2958  | 2008  | −816  | −816  | 2958  | 2008  |
| Word 7  | −816  | 2958  | 3800  | 3800  | −2954 | −1978 | 2958  |
| Word 8  | 2008  | −2954 | −3800 | −1978 | −2954 | −1978 | 2958  |
| Word 9  | 2008  | −2954 | −1978 | 2958  | −816  | 2958  | 2008  |
| Word 10 | 2008  | −816  | 1058  | −816  | −816  | 1058  | −816  |
| Word 11 | 2008  | −816  | 2958  | 3800  | −2954 | −3800 | −3800 |
| Word 12 | 3800  | 2008  | −2954 | −1978 | 2008  | −816  | 1058  |
| Word 13 | 3800  | 2008  | −816  | 2958  | 3800  | 3800  | 3800  |
| Word 14 | 3800  | 3800  | 2008  | −816  | 3800  | 2008  | −2954 |
| Word 15 | 3800  | 3800  | 3800  | 3800  | 2008  | −2954 | −1978 |

Upon successful reading and translation of the first 3-bit sub-sequence, the decoder is ready to shift its reading window function one bit to the right to read the second 3-bit sub-sequence, corresponding to bits C0, C1, and C2. Referring to FIG. 6C, the reading window function 699.p2 is seen to occupy a second position, focusing the decoder on these three bits. The second sub-sequence of three bits, corresponding to C0, C1, and C2 is thus read to be: 0 0 0.

The decoder again consults Table 1 to find a corresponding sample value for the second bit pattern. The 16-bit sample value corresponding to the bit pattern 000 is −3800, which is stored in the first row and second column of Table 3.

Upon successful reading and translation of the second 3-bit sub-sequence, the decoder is ready to shift its reading window function one bit to the right to read the next 3-bit sub-sequence, corresponding to bits C1, C2, and C3. Referring to FIG. 6D, the reading window function 699.p3 is seen to occupy a third position, focusing the decoder on these three bits. The third sub-sequence of three bits, corresponding to C1, C2, and C3 is thus also read to be: 0 0 0.

The decoder again consults Table 1 to find a corresponding sample value for the second bit pattern. The 16-bit sample value corresponding to the bit pattern 000 is −3800 again, which is stored in the first row and third column of Table 3.

Upon successful reading and translation of the third 3-bit sub-sequence, the decoder is ready to shift its reading window function one bit to the right to read the fourth 3-bit sub-sequence. This window sliding process is, in one embodiment, repeated sequentially for each 3-bit sub-sequence.

It is appreciated that sequences starting at C3 and P0 are skipped because the samples corresponding to bits P0 and P3 are known and do not need to be entered into Table 3, which contains samples only for the unknown bits. Bits A5, P0, P3, and Q3 are included in Table 2 only because they affect unknown bits due to ISI.

Now with reference to FIG. 6E, the decoder's reading window function is seen at in a final position 699.p9, having read the three 3-bit sequences in between, the description of which is omitted herein for brevity and clarity. The seventh, and in the present example, final sub-sequence of three bits corresponding to Q1, Q2, and Q3 is thus read to be: 0 0 1.

Again, the decoder consults Table 1 to find a corresponding sample value for the final read bit pattern. The 16-bit sample value corresponding to the bit pattern 001 is −1978, which is stored in the first row and seventh column of Table 3. The tabulated sample values thus applied by the decoder as follows.

Maximum likelihood decoding works, in one embodiment, by finding the codeword that minimizes the sum in Equation 1, below.

$$\sum_{i=0}^{N-1} (r_i - f(c_{i-1}, c_i, c_{i+1}))^2 \qquad \text{Equation 1}$$

where $r_i$ is the quantized received sample, and $f(c_{i-1}, c_i, c_{i+1})$ corresponds to the 16-bit integer values of the 3-bit sequences in Table 1.

In conventional decoding schemes, N is typically quite large, rendering application of Equation 1 impracticable for low power applications, such as palmtop computers. By contrast, the present embodiment limits N to seven (7). Importantly, this limitation effectuates practical maximum likelihood decoding in palmtop computers and other low power devices.

In the present embodiment, $c_i$ refers to the current unknown bit, $c_{i-1}$ refers to the previous bit, and $c_{i+1}$ refers to the subsequent bit. The index, i, of the summation points to 7 of the unknown bits: C0, C1, C2, C3, Q0, Q1, and Q2. For example, when the index, i, is zero, the function, $f(c_{i-1}, c_i, c_{i+1})$ refers to the expected sample from Table 1 for the three bit sequence, A5, C0, C1. Likewise, when the index, i, is one, the function, $f(c_{i-1}, c_i, c_{i+1})$ refers to the expected sample from Table 1 for the three bit sequence, C0, C1, C2. This process is exactly the same windowing algorithm as described above. Therefore, the samples for the function, $f(c_{i-1}, c_i, c_{i+1})$, are the samples from Table 3.

Because $c_{i+1}$ is unknown for the last bit (e.g., Byte 6/bit 0) of FEC 2 (Q) 508, it is not included in calculations performed using Equation 1, nor is it included in Table 3. However, Q3 is used as the value $c_{i+1}$ to calculate the value of f for Q2.

Referring again to Equation 1 above, $r_i$, where i runs from 0 to 6, representing received bits $r_0$, $r_1$, $r_2$, $r_3$, $r_4$, $r_5$, and $r_6$, may be generated as follows. The seven received bits $r_0$–$r_6$ correspond C0, C1, C2, C3, Q0, Q1, and Q2, respectively. For Word 0, row 0 of Table 3 is used to look up $f(c_{i-1}, c_i, c_{i+1})$, in the calculation of Equation 1. Thus, the calculations for Equation 1 for Word 0 are as follows.

$(r_0-(-2954))^2+(r_1-(-3800))^2+(r_2-(-3800))^2+(r_3-(-1978))^2+(r_4-2008)^2+(r_5-(-2954))^2+(r_6-(-1978))^2$.

Likewise, for Word 1, row 1 of Table 3 is used to look up $f(c_{i-1}, c_i, c_{i+1})$. Equation 1 for Word 1 is calculated to be:

$(r_0-(-2954))^2+(r_1-(-3800))^2+(r_2-(-1978))^2+(r_3-(-2958))^2+(r_4-3800)^2+(r_5-(-2008))^2+(r_6-(-2954))^2$.

This calculation is repeated for each of the 16 rows in Table 3, above.

In one embodiment, Equation 1 is repetitively solved by the decoding functionality for each of the 16 words Words 0–15 in Table 3 above. The word (e.g., row of Table 3) that minimizes the sum in Equation 1 is selected by the decoder as the best choice. For example, if Word 3 produces the minimum value of the sum for Equation 1, the decoder looks up the number corresponding to Word 3 in Table 2.

Correspondingly, the decoder chooses the values for the bit stream C0, C1, C2, C3 as equal to 0, 0, 1, 1; e.g., CO C1 C2 C3=0 0 1 1. Further correspondingly, the decoder chooses the values for the bit stream Q0, Q1, Q2, Q3 as equal to 1, 0, 1, 0; e.g., Q0 Q1 Q2 Q3=1 0 1 0. Thus, the decoder of the present embodiment efficiently thus determines the best possible estimate of the unknown received data.

Importantly therefore, the maximum likelihood decoding of input streams containing known data advantageously effectuates the accurate and efficient determination of unknown data also therein. It does by taking advantage of the known data, thus reducing the computational resources requisite to achieve maximum likelihood soft decision decoding. Thus, decoders functioning according to the present embodiment may be operationally deployed effectively on smaller platforms, such as palmtop computers and on devices and/or systems of relatively limited processing, memory, power, and/or speed. Further advantageously, the present embodiment achieves the foregoing with amelioration of the effects of the problematic ISI.

Exemplary Process for Creating a FEC Soft Decision Words Table

In one embodiment of the present invention, a process executed by a processor (e.g., processor 101; FIG. 4) on a decoding platform (e.g., system 100; FIG. 1, 4) generates a table of FEC soft decision words, such as Table 3 above. With reference to FIG. 7, a Process 700 exemplifies this table creation. Process 720 begins with step 710, wherein the value of x, above for a bit of received data is zero, e.g., the received bit, $r_0$, is the first bit of a stream of data received for decoding.

In step 720, bits A5, C0, and C1 are extracted from row x of a table of FEC Words (e.g., Table 2). The values of the bits so extracted are looked up in an ISI table (e.g., Table 1). The results are stored in a table (e.g. Table 3) at location (x, 0), where x refers to the row and 0 refers to the column. In the present example, where x equals zero, the results of step 710 are stored in location (0, 0) of Table 3.

In step 730, bits C2, C3, and P0 are extracted from row x of a table of FEC Words (e.g., Table 2). The values of the bits so extracted are looked up in an ISI table (e.g., Table 1). The results are stored in location (x, 3) of a table (e.g. Table 3). In the present example, where x equals zero, the results of step 730 are stored in location (0, 3) of Table 3.

In the very next sequential step, e.g., step 740, bits P3, Q0, and Q1 are extracted from row x of a table of FEC Words (e.g., Table 2). The values of the bits so extracted are looked up in an ISI table (e.g., Table 1). The results are stored in location (x, 4) of a table (e.g. Table 3). In the present example, where x equals zero, the results of step 740 are stored in location (0, 4) of Table 3.

This is repeated for the unknown bits (e.g. bits C0, C1, C2, C3, Q0, 01, Q2) until in step 750, bits Q1, Q2, and Q3 are extracted from row x of a table of FEC Words (e.g., Table 2). The values of the bits so extracted are looked up in an ISI table (e.g., Table 1). The results are stored in location (x, 6) of a table (e.g. Table 3). In the present example, where x equals zero, the results of step 750 are stored in location (0, 6) of Table 3.

In step 760, it is determined whether x is less than 15.

If it is determined in step 760 that x is less than 15, then in step 770, x is set equal to x+1, and process 700 loops back to repeat, beginning again at of step 720 for the new value of x. In the present example, x is incremented to become 1. The next 7 results obtained from Processes 720 through 750 are stored in row 1 of Table 3. Then x will again be incremented, and Processes 720 through 760 are repeated until x is equal to 15.

If in step 760, it is determined that x is not less than 15, then Process 700 is complete.

Exemplary Process for Decoding Received Data

Figure 8:
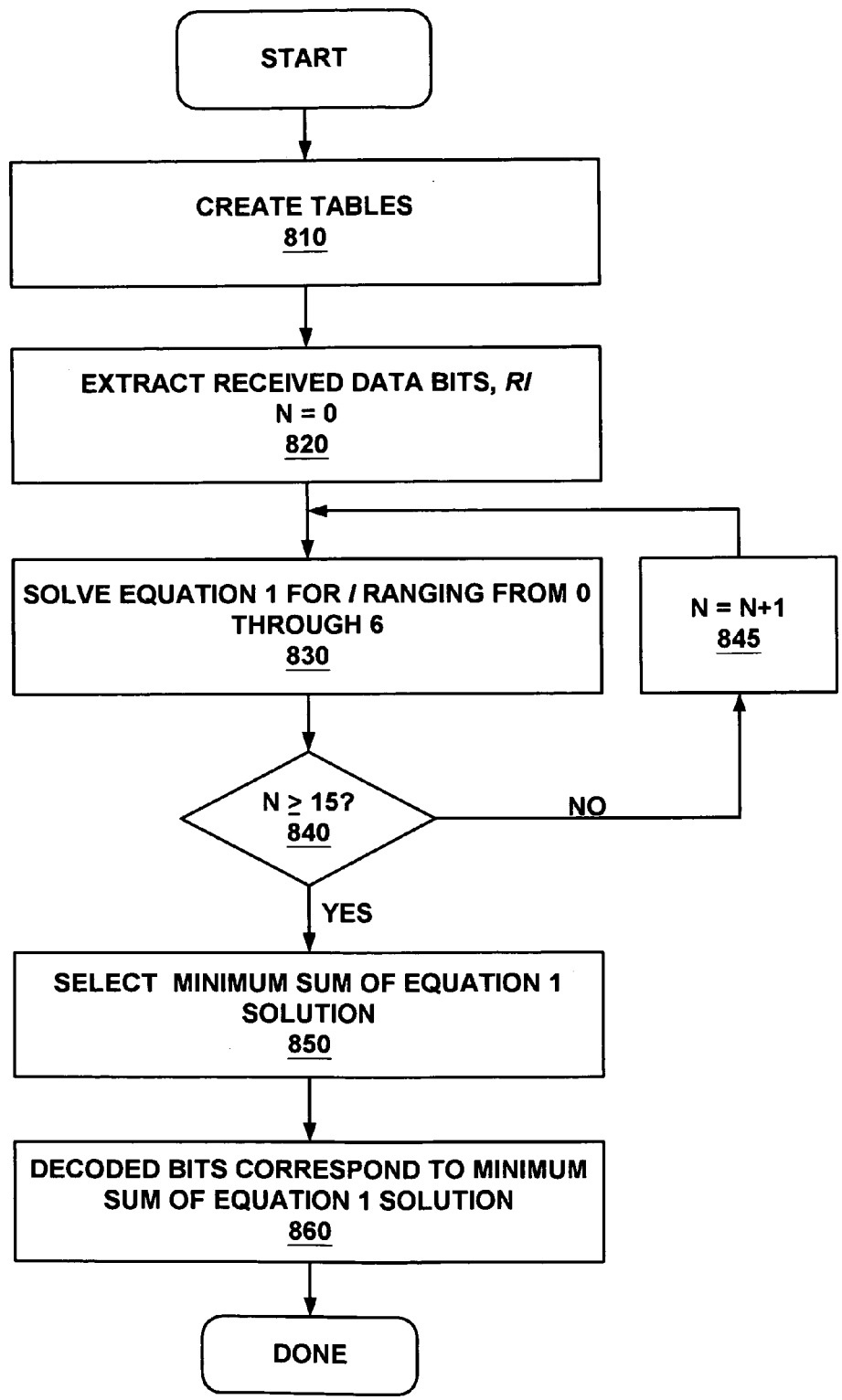
FIG. 8 is a flowchart of the steps in a process for decoding received data, in accordance with the present invention.

Some of the embodiments of the present invention effectuate maximum likelihood soft decision decoding while ameliorating ISI. With reference to FIG. 8, one such embodiment is Process 800. Process 800 begins at step 810, wherein tables are created. Such tables may include in one embodiment an ISI table, a table of FEC words, and a table of FEC soft decision words (e.g., Tables 1, 2, and 3 respectively). In another embodiment, one or more such tables may be omitted from creation, e.g., they may already be extant as lookup tables on a host, or the requirement for which may otherwise be satisfied.

Such tables may be created and stored in a number of ways in various embodiments. For example, an ISI table (e.g., Table 1), in one embodiment of the present invention, has sample values determined for the 8 possible 3-bit sequences. The corresponding sample values are derived empirically, e.g., they are predetermined in a laboratory, by observing the value of samples for known bit patterns and the values tabulated. The sample values are 16-bit integers representative of the analog signal waveform corresponding to 3-bit binary sequences. The resultant tables can be stored on a host processor. In one embodiment, an appropriate such table is downloaded to the DSP (e.g., DSP 120; FIG. 4 or substitute components, as discussed above) at runtime.

In another example, a partial table of FEC soft decision words (e.g., Table 3), in one embodiment, is generated from other tables (e.g., Tables 1 and 2) on a host device (e.g., system 100; FIG. 1, 4). In one embodiment, such a table is generated by a process such as process 800 (FIG. 7) described above.

In step 820, all the received data samples, $r_i$, are extracted, where i ranges from 0 to 6, and a counter, n, is set to zero.

In step 830, for all values of i ranging from 0 through N−1, a maximum likelihood decoding equation $$\sum_{i=0}^{N-1}(r_i - f(c_{i-1}, c_i, c_{i+1}))^2 \text{ (e.g., Equation 1),}$$

where $r_i$ is the received sample, and $f(c_{i-1}, c_i, c_{i+1})$ corresponds to one of the values in the 3-bit sequences in Table 1, is solved.

In conventional decoding schemes, N is typically quite large, rendering application of Equation 1 impracticable for low power applications, such as palmtop computers. By contrast, the present embodiment limits N−1 to six (6). Importantly, this limitation effectuates practical maximum likelihood decoding in palmtop computers and other low power devices.

A decision is made in step 840 as to whether n is greater than or equal to 15, which indicates that all of the codewords have been processed.

If it is determined in step 840 that n is less than 15, a subsequent value of n, e.g., n+1, is considered in step 845. Process 800 loops, at this point, back to step 830, wherein Equation 1 is solved again.

On the other hand, if it is determined in step 840 that n is greater than or equal to 15, process 800 proceeds to step 850, wherein the minimum solution of the above equation is selected. The bits that correspond to the minimum sum of Equation 1 are chosen as the decoded bits, and process 800 is complete.

It is appreciated that processes 700 and 800 depicted in the flowcharts of FIGS. 7 and 8, respectively, effectuate various embodiments of maximum likelihood soft decision decoding. These figures depict flowcharts of processes which, in one embodiment, are carried out by processors and electrical/electronic components under the control of computer readable and computer executable instructions. The computer readable and computer executable instructions reside, for example, in computer system (e.g., system 100; FIG. 1, 4) features such as a processor 101, computer usable volatile memory 102 and/or computer usable non-volatile memory 103, and/or data storage device 104 of FIG. 4.

However, the computer readable and computer executable instructions may reside in any type of computer readable medium. Although specific methods are disclosed in FIGS. 7 and 8 and their respective processes 700 and 800, and the text above rendering an accompanying discussion thereof, such processes are exemplary. That is, embodiments of the present invention are well suited to performing various other processes or variations of the processes recited in FIGS. 7 and 8 and the text rendering an accompanying discussion thereof. Within the present embodiment, it should be appreciated that the processes of flowcharts 7 and 8 and their respective processes and the text rendering an accompanying discussion thereof, may be performed by, e.g., executed upon, software, firmware, and/or hardware or any combination of software, firmware, and/or hardware. In one embodiment, they are performed by a computer system (e.g., system 100; FIG. 1, 4) under the control of a computer usable medium having a computer readable program code embodied therein for causing a computer system to perform the steps of the process described. It is appreciated that such computer readable media may be run on an operating system of a computer. In one embodiment, this operating system is Palm Operating System™, a product of Palm, Inc. of Santa Clara, Calif.

In summary, in accordance with one embodiment of the present invention, a method and system are described for efficiently and accurately decoding a signal in white Gaussian noise. A method and system are also described for decoding a signal in a noisy environment using a maximum likelihood soft decision decoder. Further, a method and system are described for decoding a signal in a noisy environment using a maximum likelihood soft decision decoder, which mitigates the problems of inter-symbol interference (ISI). Further still, a method and system are described for decoding a signal in a noisy environment using a maximum likelihood soft decision decoder that mitigates the problems of ISI, which is implemented upon a platform which may have relatively limited computational capabilities.

In one embodiment, the data bits to be transmitted are encoded using a shortened Hamming Code, such as a (12, 8) Hamming Code. The present embodiment is thus compliant with the MOBITEX specification. The problem of ISI is treated in the present embodiment by sequentially processing adjacent 3-bit successions of data. A table stored on a host processor is downloaded to a digital signal processor (DSP) on-board the decoding platform at runtime. The table contains the 8 possible optimally sampled values of the analog signal derived empirically beforehand (e.g., by experimental observation in a laboratory) corresponding to the values of the pulses generated by all possible 3-bit patterns.

In one embodiment, decoding utilizes known information in the frame header. The present embodiment makes use of the known information to decode the unknown information, effectively reducing the size of the required codebook functionality and advantageously reducing the requisite computational power and time to execute the decoding. The decoding platform in some embodiments may be a palmtop computer. Decoding proceeds in some embodiments via maximum likelihood decoding, wherein codewords are found which minimize a certain sum corresponding to data values extracted from header information.

In one embodiment, several lookup tables are consulted. One such table contains the expected samples which take the effect of ISI into consideration as above. Another table contains the binary values of certain forward error control (FEC) words. A further table contains, in one embodiment, a list of FEC soft decision words. In the present embodiment, the soft-decision words correspond to 16-bit quantization of digitally sampled (e.g., by analog to digital (A/D) conversion) analog waveform carrying binary information. Importantly, the tables are relatively small in size, a further benefit of the use of previously known information to decode unknown data. This has the advantage of minimizing the computational resources needed to execute the decoding, such that, in some embodiments, the decoding platform may also be a palmtop computer.

Thus, the present invention provides a system and method for efficiently decoding a data stream in accordance with the limited resources available in palmtop computer systems and other small, low-power devices. In addition, the present invention provides a system and method that do not consume a large amount of the available memory space in such devices.

The preferred embodiment of the present invention, a method and system providing maximum likelihood soft decision decoding for input streams containing known data, is thus described. While the present invention has been described in particular embodiments, it should be appreciated that the present invention should not be construed as limited by such embodiments, but rather construed according to the below claims.

What is claimed is:

1. A computerized method for decoding a sequence of binary digits of a received signal comprising:
   a) accessing said received signal comprising data and a sample;
   b) extracting a data bit from said received signal;
   c) accessing a received table;
   d) indexing said received table to map said data bit to a corresponding known value;
   e) calculating a sum comprising a squared difference between said sample and said known value;
   f) storing said sum into a memory unit; and
   g) selecting a codeword from a memory resident table corresponding to a minimum value of said sum.

2. The method as recited in claim 1, wherein said steps c) through g) are repeated to select a plurality of codewords.

3. The method as recited in claim 1, wherein said sum comprises a series of values.

4. The method as recited in claim 3, further comprising selecting one of said series of values.

5. The method as recited in claim 4, wherein said selecting one of said values further comprises selecting a value minimizing said sum.

6. The method as recited in claim 1, wherein said memory resident table comprises a first table of forward error control soft decision words, said method further comprising creating a plurality of second tables.

7. The method as recited in claim 6, wherein said plurality of second tables comprises forward error control words.

8. The method as recited in claim 6, wherein said plurality of second tables further comprises forward error control words with extract bits for inter-symbol interference determination.

9. A computer system comprising:
   a bus;
   a processor coupled to said bus; and
   a computer-readable memory unit coupled to said bus;
   wherein said processor performs a method for decoding a sequence of binary digits of a received signal, said method comprising:
      accessing said received signal comprising data and a sample;
      extracting a data bit from said received signal;
      accessing a received table;
      indexing said received table to map said data bit to a corresponding known value;
      calculating a sum comprising a squared difference between said sample and said known value;
      storing said sum into said computer-readable memory unit; and
      selecting a codeword from a memory resident table corresponding to a minimum value of said sum.

10. The system as recited in claim 9 wherein said sum further comprises a series of values.

11. The system as recited in claim 10, further comprising selecting one of said series of values.

12. The system as recited in claim 11, wherein said selecting one of said values further comprises selecting a value minimizing said sum.

13. The system as recited in claim 9, wherein said memory resident table comprises a first table of forward error control soft decision words, said method further comprising creating a plurality of second tables.

14. The system as recited in claim 13, wherein said plurality of second tables comprises a table selected from a list consisting of forward error control words and forward error control words with extract bits for inter-symbol interference determination.

15. The system as recited in claim 9 wherein said device comprises a portable computer system.

16. A computer usable medium having a computer readable program code embodied therein for causing a computer system to perform a method for decoding a sequence of binary digits of a received signal, said method comprising:
   accessing said received signal comprising data and a sample;
   extracting a data bit from said received signal;
   accessing a received table;
   indexing said received table to map said data bit to a corresponding known value;
   calculating a sum comprising a squared difference between said sample and said known value;
   storing said sum into a memory unit; and
   selecting a codeword from a memory resident table corresponding to a minimum value of said sum.

17. The computer usable medium as recited in claim 16 wherein said sum further comprises a series of values.

18. The computer usable medium as recited in claim 17, further comprising selecting one of said series of values.

19. The computer usable medium as recited in claim 18, wherein said selecting one of said values further comprises selecting a value minimizing said sum.

20. The computer usable medium as recited in claim 16, wherein said memory resident table comprises a first table of forward error control soft decision words, said method further comprising creating a plurality of second tables.

21. The computer usable medium as recited in claim 20, wherein said plurality of second tables comprises a table selected from a list consisting of forward error control words and forward error control words with extract bits for inter-symbol interference determination.

22. The computer usable medium as recited in claim 16, wherein said method is executed by a portable computer.

23. In a receiver system comprising a processor and a memory, a computerized method for decoding a received signal comprising a frame header with a known forward error correction (FEC) component, said frame header also comprising control bytes with parity, said computerized method comprising:
   accessing said received signal;
   accessing a received table comprising a first plurality of sample values corresponding to individual bit combinations, said received table stored in said memory;
   determining an instantaneous value of said received signal;
   generating parity data corresponding to said control bytes, said parity data compiled into a first memory resident table with said control bytes;
   accessing a second memory resident table comprising a second plurality of data signals affecting said control bytes and said FEC component;
   generating a third memory resident table comprising information combined from said received table and said first and second memory resident tables;
   summing a sum in said processor the square of the difference between said instantaneous value and corresponding said sample values;
   repetitively indexing said third memory resident table for subsequent individual bit combinations; and
   selecting a codeword from said third memory resident table corresponding to a minimum value of said sum.

* * * * *